(12) United States Patent
Yuen et al.

(10) Patent No.: US 10,271,448 B2
(45) Date of Patent: Apr. 23, 2019

(54) THIN LEADFRAME QFN PACKAGE DESIGN OF RF FRONT-ENDS FOR MOBILE WIRELESS COMMUNICATION

(71) Applicant: INVESTAR CORPORATION, Taipei (TW)

(72) Inventors: Cindy Yuen, Saratoga, CA (US); Duc Chu, San Jose, CA (US)

(73) Assignee: INVESTAR CORPORATION, Taipei (TW)

( * ) Notice: Subject to any disclaimer, the term of this patent is extended or adjusted under 35 U.S.C. 154(b) by 284 days.

(21) Appl. No.: 13/959,941

(22) Filed: Aug. 6, 2013

(65) Prior Publication Data

US 2014/0036471 A1    Feb. 6, 2014

Related U.S. Application Data

(60) Provisional application No. 61/742,272, filed on Aug. 6, 2012.

(51) Int. Cl.
| | |
|---|---|
| *H05K 7/02* | (2006.01) |
| *H05K 3/30* | (2006.01) |
| *H01L 23/495* | (2006.01) |
| *H01L 23/00* | (2006.01) |

(52) U.S. Cl.
CPC ............ *H05K 7/02* (2013.01); *H01L 23/495* (2013.01); *H01L 23/49541* (2013.01); *H01L 23/49575* (2013.01); *H05K 3/30* (2013.01); *H01L 24/48* (2013.01); *H01L 2224/04042* (2013.01); *H01L 2224/05554* (2013.01); *H01L 2224/48137* (2013.01); *H01L 2224/48247* (2013.01); *H01L 2224/48265* (2013.01); *H01L 2924/00014* (2013.01); *H01L 2924/15747* (2013.01); *H01L 2924/19107* (2013.01); *H01L 2924/3011* (2013.01); *H01L 2924/30107* (2013.01); *Y10T 29/49121* (2015.01)

(58) Field of Classification Search
CPC ... H05K 7/02; H01L 23/495; H01L 23/49541; H01L 23/49575
USPC .............................................. 361/813; 29/827
See application file for complete search history.

(56) References Cited

U.S. PATENT DOCUMENTS

| | | | |
|---|---|---|---|
| 5,536,906 A * | 7/1996 | Haas et al. ..................... | 174/529 |
| 6,608,367 B1 * | 8/2003 | Gibson et al. ................ | 257/666 |
| 8,525,729 B1 * | 9/2013 | Martin .................... | 343/700 MS |

(Continued)

*Primary Examiner* — Bernard Rojas
(74) *Attorney, Agent, or Firm* — Gokalp Bayramoglu

(57) ABSTRACT

Systems and methods are disclosed herein for a low cost, compact size, and thin half-etched leadframe quad-flat no-leads (QFN) package that integrates RF passive elements in the QFN leadframe for linearized PA design and RF FEMs. The integrated RF passive elements in the QFN leadframe may include RF inductors (e.g., meanders lines or spirals) for amplifier bias or RF matching, extension bar of the ground paddle for inter-stage matching or jumper pads for connection. The integrated RF passive elements may also include transmission lines for output power matching, coupled line structures such as RF couplers, RF divider or combiner realized using transmission lines with proper impedance and length, jumper pads for adjusting the bond wire length, etc. The RF parameters of the integrated passive elements are adjustable using different length and number of wire bond for fine tuning the performance of the PAM or the RF FEM.

18 Claims, 4 Drawing Sheets

(56) References Cited

U.S. PATENT DOCUMENTS

2006/0113646 A1* 6/2006 Channabasappa et al. .. 257/678
2008/0290486 A1* 11/2008 Chen et al. ................ 257/676
2009/0200649 A1* 8/2009 Tanaka et al. ............. 257/676
2012/0104584 A1* 5/2012 Chen et al. ................ 257/676

* cited by examiner

THIN LEADFRAME QFN PACKAGE DESIGN OF RF FRONT-ENDS FOR MOBILE WIRELESS COMMUNICATION

CROSS-REFERENCE TO RELATED APPLICATIONS

This application is a non-provisional application of and claims the benefit of priority of U.S. provisional application Ser. No. 61/742,272, filed on Aug. 6, 2012. The contents of the provisional application are hereby incorporated by reference in its entirety.

TECHNICAL FIELD

The present disclosure relates generally to wireless communication. In particular, the present disclosure relates to methods and systems for package design of radio frequency (RF) front-end modules (FEMs) or components for mobile wireless communication systems.

BACKGROUND

RF FEMs are used in wireless communication systems to process RF signals received from antennas and/or to generate RF signals for transmission over antennas. For example, RF FEMs in radio transmitters may be used to up-convert, amplify, and filter modulated baseband signals to the RF band. A critical component of RF FEMs is the power amplifier (PA). In many mobile wireless communication systems (such as WiFi, WiMax, 2G/2.5G/3G/4G, GSM/EDGE, WCDMA, LTE, TD-SCDMA used in handsets, smartphones, or tablets, etc.), a linearized power amplifier (LPA) with excellent performance is required. Due to the increasing complexity of multi-mode, multi-band capable mobile devices like smartphones, LPAs need to meet stringent performance requirements of high power (for long distance communication), high linearity (for high fidelity to enable high data rate communication), and high efficiency (for long battery life of mobile devices). In addition, LPAs or LPA modules need to be low cost and compact to enable their use in an ever wider array of mobile devices.

Conventionally, LPA modules or RF FEMs use a laminate design approach. The laminate design for a LPA module (or more generally PA module (PAM)) or RF FEM product needs a multi-layer substrate to incorporate active devices such as the PA die, low-noise amplifiers (LNA), or switches (e.g., single-pole multi-throw (SPXT)), and passive components such as resistors/inductors/capacitors (R/L/C) packaged in surface mount devices (SMDs) for PA input or inter-stage or output matching, biasing, bypassing, DC blocking, etc. The multi-layer substrate may also incorporate passive filters (surface acoustic wave (SAW) or bulk acoustic wave (BAW) filters), or duplexer or diplexer parts. The laminate substrate for a PAM or FEM product typically needs 4-6 layers depending on the complexity, since it needs to embed these active and passive devises, SMD components, and may be RF switch command lines, couplers, etc., inside PAM or FEM package. Therefore, the PAM or RF FEM product using this multi-layer substrate package will be expensive due to the high substrate cost and the cost for the passive SMD parts. The package is also thick and bulky due to the multi-layer substrate. In addition, the cost for assembling the package is high due to a dual assembly process for both die attaching and wire bonding for die assembly, and the SMD part assembly using solder reflow.

As such, there is a need for a package for the PAM or RF FEM product that is low cost, compact and low profile.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
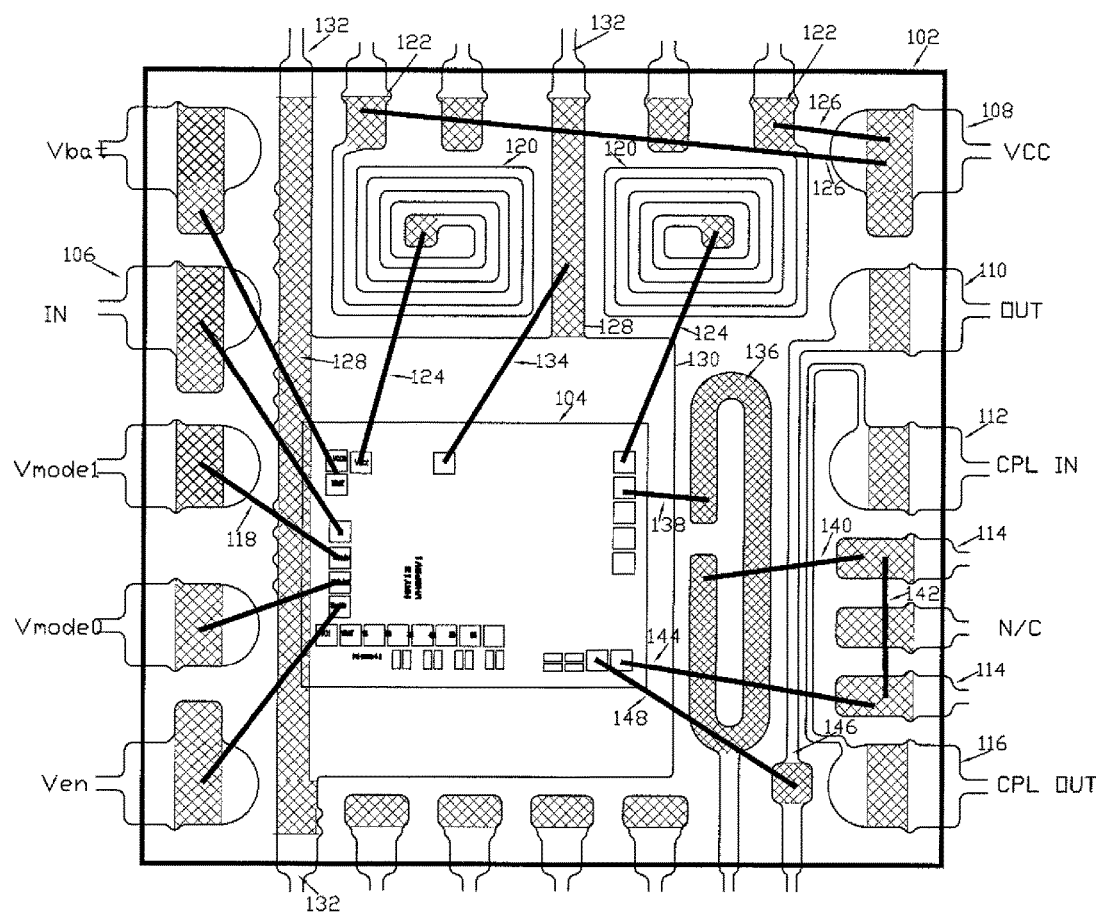
FIG. 1 shows a quad-flat no-leads (QFN) leadframe design for a PA module that incorporates a PA die and integrates RF passive elements including RF inductors, transmission lines, and a coupler line in the QFN leadframe for DC bias, RF matching, and RF power coupling of the PA die according to one or more embodiments of the present disclosure.

Systems and methods are disclosed herein for a low cost and compact size half-etched leadframe quad-flat no-leads (QFN) package that integrates RF passive elements in the QFN leadframe for linearized PA design and RF FEMs. The integrated RF passive elements or structures in the QFN leadframe may include RF inductors (e.g., meanders lines or spirals) for amplifier bias or RF matching, extension bar of the ground paddle for inter-stage matching, or jumper pads for DC or RF connection. The integrated RF passive elements may also include transmission lines for output power matching, coupled line structures such as RF couplers (side coupled or top or bottom coupled to transmission lines with thin gap), RF divider or combiner realized using transmission lines with proper impedance and length, jumper pads for adjusting the bond wire length, etc. The inductance, RF transmission line length, and other parameters of the integrated passive elements are adjustable using different length and number of wire bond for fine tuning the performance of the PAM or the RF FEM. The ability to adjust the amplifier bias, PA input matching, inter-stage matching, or output power matching provides the flexibility to fine tune the PAM for specific requirements. For example, fine tuning may be made to perform tradeoffs of linearity vs. current, or linearity vs. gain to meet stringent requirements for linearity, output power, current, and gain of PAMs in mobile communication systems.

In one or more embodiments of the leadframe QFN package for PA modules, the leadframe may integrate RF inductors for PA bias trace (e.g., printed meander lines or transmission lines), ground bars for PA inter-stage matching optimization through wire bond (e.g., providing shunt inductance to ground), wire bond and transmission lines for PA output matching (in conjunction with shunt cap and DC block cap on PA die), special jumper pads for DC bias or RF matching, and a coupler to feed RF signal to external detector circuits for PA power measurements.

The leadframe QFN package may incorporate RF active dies that connect with the integrated RF passive elements. For example, a PA die may be attached and wire bond from a PA die pad to the integrated RF/DC ground bar in the QFN leadframe package may provide inter-stage or output matching for the PA die. These matching elements are critical for the RF performance (gain, power, linearity, efficiency, etc.) of the PA module. In one or more embodiments, a connection bar integrated in the QFN leadframe package may provide connections between different active dies to provide voltage supply, logic command, matching, etc. For multiple dies in a QFN package, the wire bonds can be within a single die, from one die to another die, or from a die to passive structures integrated in QFN leadframe package. The multiple dies inside the QFN package can be attached separately or stacked one die on top of the other die in order to further reduce the package size. The die layout is to be carefully designed to match with the optimized passive structures integrated in the QFN leadframe package in order to achieve the goals of optimal performance, compact size and low cost.

The leadframe QFN package may incorporate passive components along with active dies. For example, the leadframe QFN package may incorporate passive filters, duplexers, diplexers, SAW, or BAW as dies. A passive die can be attached and wire bond used to connect the passive die to the integrated passive elements in the QFN leadframe, similar to the active die. In addition, SAW filters or duplexers have evolved into flip chip dies with solder or Cu-pillar bumps (die-sized SAW packaging (DSSP package)) that use wafer level package (WLP) technique. This DSSP package already includes the proper cavity needed for the SAW die to achieve good performance. A passive SAW or duplexer in a flip chip DSSP package, without bumps but with Au plated pads, may be assembled like a wire bond die inside QFN leadframe package using die attach and wire bond processes, similar to the active die.

Advantageously, active and passive dies may be incorporated in a low cost, compact size, thin QFN leadframe package. The cost is reduced because the QFN leadframe is significantly lower in cost compared to the expensive laminate 4-6 layers substrate of a multi-layer substrate package. In addition, all SMD parts are eliminated and have been replaced by the free printed traces in the QFN leadframe and proper wire bond adjusted through varying its length or using the jumper pads. For example, SMD inductors may be replaced by printed transmission lines or spirals inside QFN and/or proper wire bond length. SMD inductors for PA output matching may be realized by optimizing wire bond length or transmission line length or impedance, or a combination of wire bond length & transmission line length/impedance. A coupler may be embedded in the QFN leadframe design to RF-edge couple the PA output. It is also possible to integrate a coupler on the PA die, instead of using the coupler integrated in the QFN leadframe package, if it meets the overall goals of cost, size, and performance. PA output matching capacitors and DC blocking capacitors may also be integrated on the PA die due to their small size. In addition to the material cost savings from the elimination of the multi-layer substrate and SMD parts, the assembly cost is also reduced since package assembly only requires a die attach and wire bond process and does not require the additional SMD parts solder and the reflow process.

Compared to the traditional 4-6 layer substrate package that has a typical thickness of ~1 mm, the QFN leadframe package has the additional benefit of being thin, with a thickness typically on the order of ~0.5 mm. The QFN leadframe package is also more compact due to the elimination of the SMD parts. The compact, thin QFN leadframe package will enable new applications of the PA module or RF FEM in mobile devices when used standalone, or may enable higher level of integration by allowing the QFN package to be incorporated into larger modules that have tight thickness requirement. The QFN leadframe package may be used for PA modules and numerous RF FEMs in mobile wireless communication systems such as WiFi, WiMax, 2G/2.5G/3G/4G, GSM/EDGE, WCDMA, LTE, TD-SCDMA, or for WiFi applications in existing 802.11 a/b/g/n markets and the emerging 802.11 ac market.

In accordance with one or more embodiments of the present disclosure, an apparatus is disclosed. The apparatus includes a leadframe of a QFN package for an RF module. The leadframe is patterned to integrate one or more RF passive elements, where the integrated RF passive elements are wire bonded to an active die that is encapsulated in the QFN package to provide adjustable RF parameters for the operation of the active die. The RF parameters include inductance, transmission line length, or RF-coupling and the RF parameters may be adjusted using wire bond.

In accordance with one or more embodiments of the present disclosure, a method is disclosed. The method includes patterning a leadframe of a QFN package to integrate one or more RF passive elements on the leadframe. The method also includes attaching an active die to the QFN package. The method further includes bonding the active die to the integrated RF passive elements for the integrated RF passive elements to provide adjustable RF parameters for the operation of the active die. The RF parameters include inductance, transmission line length, or RF-edge coupling that are adjusted using wire bond.

Refer now to the figures wherein the drawings are for purposes of illustrating embodiments of the present disclosure only, and not for purposes of limiting the same. FIG. 1 shows a quad-flat no-leads (QFN) leadframe design for a PA module that incorporates a PA die and integrates RF passive elements including RF inductors, transmission lines, and a coupler line in the QFN leadframe for DC bias, RF matching, and RF power coupling of the PA die according to one or more embodiments of the present disclosure. FIG. 1 shows a QFN leadframe package 102 for a PA module. However, QFN leadframe package 102 may be generalized to contain RF FEMs.

A QFN package is a surface mount technology that electrically connects integrated circuits to the surface of printed circuit boards without the use of through-holes. The QFN package may be a plastic encapsulated package made with a copper leadframe. Pads on the package bottom provide electrical connections to printed circuit boards. The process flow for a half-etched QFN leadframe may involve punching or etching a large copper leadframe panel through a lithographic process to generate a desired QFN pattern. The patterned leadframe panel may contain the pattern for multiple copies of the QFN packages. The leadframe backside may be half-etched and filled with pre-molding for support. The process may also half-etch the leadframe backside to create passive elements or structures that are integrated into the QFN leadframe. The passive elements or structures may be anchored to the QFN pads for mechanical support. For package assembly, one or more dies such as a PA die may be attached to each QFN package of the leadframe panel and wire bonds placed in an auto assembly process. The wire bonds may connect a die to the integrated passive elements, a die to the pads, between the dies, etc. After the auto assembly process, a top molding layer may be placed on the QFN leadframe panel and the QFN leadframe panel may be cut into individual QFN products.

QFN leadframe package 102 of FIG. 1 incorporates a PA die 104. PA die 104 may be a compact size, highly integrated MMIC die that integrates a PA fabricated on a GaAs HBT process and a regulator, logic control circuits, etc., fabricated on a GaAs ED-PHEMT process. PA die 104 may also be a CMOS die or a SiGe BiCMOS die. For example, PA die 104 may have an integrated regulator, a temperature compensation circuit, and digital logic circuits for PA enable and for multi-mode control. In addition, shunt capacitors having proper values for PA output matching and DC blocking capacitor may be integrated on PA die 104. Pads on the left side of QFN leadframe package 102 provide various inputs such as a voltage input for PA die 104, an RF input 106 for PA die 104, and a multitude of control signals to control the operation of PA die 104. Wire bonds 118 connect pads on QFN leadframe package 102 to pads on PA die 104. Pads on the right side of QFN leadframe package 102 provide a DC voltage VCC 108 to PA die 104, an RF output 110 from PA die 104, a coupler input pad 112, jumper pads 114, and a coupler output pad 116.

The passive elements integrated on QFN leadframe package 102 include spiral inductors 120. Spiral inductors 120 are printed traces in the form of spirals and are electrically connected to, and mechanically supported by, jumper pads 122. Spiral inductors 120, jumper pads 122, and adjustable wire bond may be used in conjunction with capacitors and/or inductors integrated on PA die 104 to provide DC biasing or RF input matching of PA die 104. For example, PA bias chokes for DC voltage may be realized by connecting wire bonds 124 from pads on PA die 104 to spiral inductors 120 and connecting wire bonds 126 from jumper pads 122 to VCC 108. Two spiral inductors 120 and two jumper pads 122 may be wire bonded for the PA bias chokes. The length of wire bonds 124, 126 may be adjusted so that the inductance of the wire bonds, spiral inductors 120, and jumper pads 122 is the desired inductance for DC bias. In one or more embodiments, spiral inductors 120 and jumper pads 122 may be connected by wire bonds that are adjusted to provide the desired inductance for RF input matching. In one or more embodiments, DC biasing or RF input matching for PA die 104 may be realized using meander lines that are integrated on QFN leadframe package. The meander lines may be printed traces in forms other than spirals.

The integrated passive elements also include ground bars 128 that are extensions of a ground pad 130 for PA die 104. Ground bars 128 and ground pad 130 are mechanically supported by pads 132. Ground bars 128 may be used for RF input or inter-stage matching. For example, PA inter-stage matching may be realized by the shunt inductance to ground realized by connecting wire bond 134 from a pad on PA die 104 to ground bars 128. The length of wire bond 134 may be adjusted to fine up the shunt inductance for proper PA inter-stage matching. Ground bars 128, the shunt inductance provided by the adjustable wire bond, and capacitors and/or inductors integrated on PA die 104 provide the inter-stage matching network for PA die 104. Ground bar 128 may also be connected by wire bond to spiral inductors 120 or meander lines to provide RF input or inter-stage matching.

The integrated passive elements also include transmission U-line 136. The proper impedance of transmission U-line 136 may be defined by its width. Transmission U-line 136 and jumper pads 114 may be used for PA RF output power matching. For example, PA RF output matching may be realized by connecting wire bond 138 from a first pad on PA die 104 to one end of transmission U-line 136, wire bond 140 from another end of transmission U-line 136 to a first jumper pad 114, wire bond 142 between the first and a second jumper pads 114, and wire bond 144 from the second jumper pad 114 to a second pad on PA die 104. The lengths of wire bonds 138, 140, 142, and 144 may be adjusted to fine tune the length of transmission U-line 136 for matching the PA RF output. In one or more embodiments, the length of wire bonds 138 or 140 may be adjusted by being wire bonded to different points along the length of transmission U-line 136. The inductance provided by the wire bonds and the jumper pads, and the impedance and length of transmission U-line 136 integrated on QFN leadframe package 102, in conjunction with the shunt capacitor and DC block capacitor integrated on PA die 104 provide the matching network for the PA RF output appearing on RF output pad 110.

The integrated passive elements also include coupler lines 146 that are thin traces of transmission lines spaced by a narrow gap to provide RF power coupling. For example, QFN leadframe package 102 may connect wire bond 148 to one trace of coupler lines 146 to provide the output from PA die 104 to RF output pad 110. The RF output signal from PA die 104 may RF-edge couple to the other trace of coupler line 146. The coupled RF signal power may be connected through coupler output pad 116 to an external detector circuit. Coupled input pad 112 may be terminated by a 50 ohm load when RF power for only a single PAM is to be measured by the external detector circuit. Alternatively, coupled input 112 may be connected to the coupled output pad of a second PAM when multiple PAMs are daisy chained for RF power of any one of the PAMs is to be measured by the external detector circuit. The external detector circuit may output a DC voltage that is proportional to the PA output power. Coupler lines 146 and the external detector circuit are relatively immune to variations in the antenna environment or output impedance to enable an accurate reading of the PA output power. The integrated passive elements such as spiral inductor 120, ground bars 128, ground pad 130, transmission U-line 136, and coupler lines 146 are anchored to the QFN leadframe or to pads of the QFN leadframe for mechanical support. To optimize the performance, size, and yield of the PA module, the layout of PA die 102, the layout of the integrated passive elements, and the length of the wire bonds need to be carefully designed.

Figure 2:
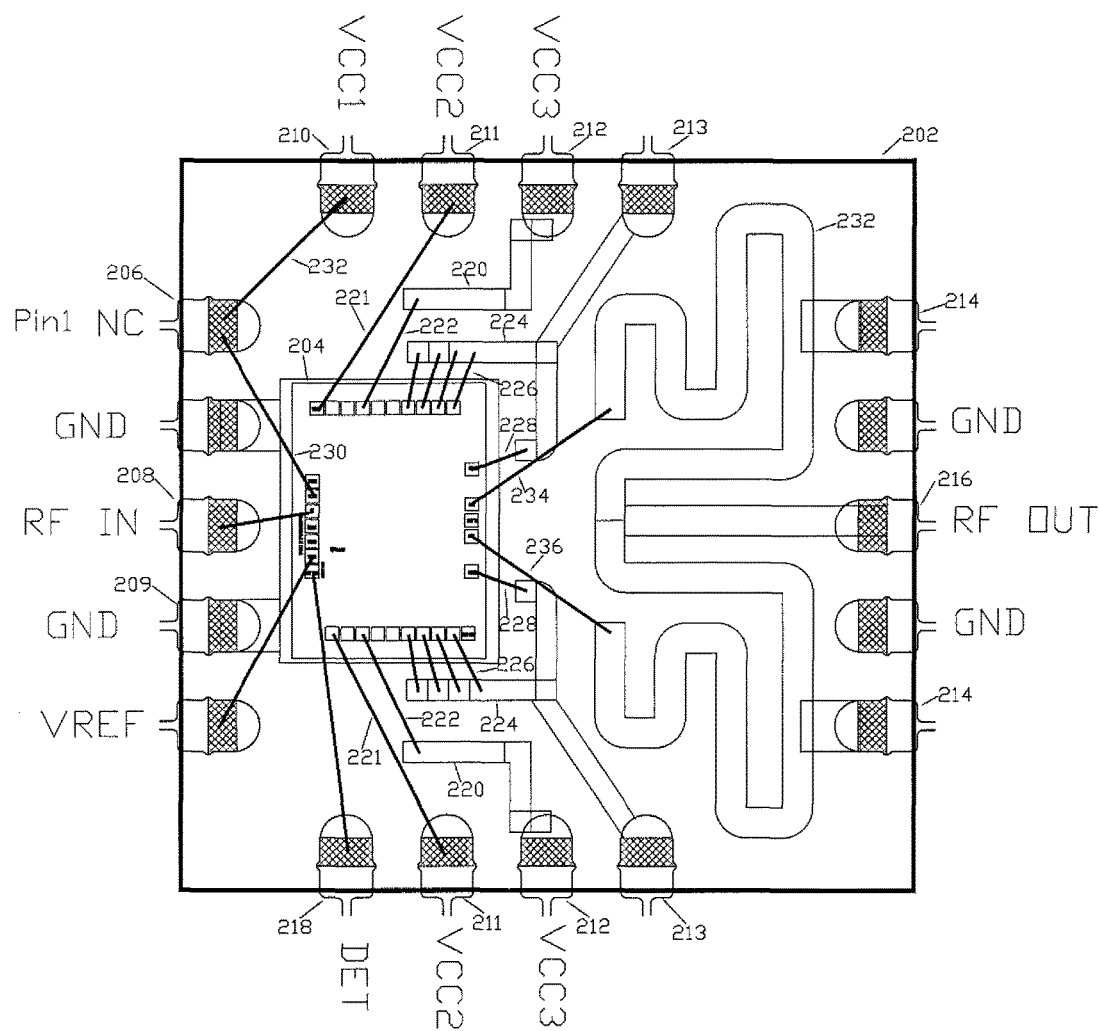
FIG. 2 shows a QFN leadframe design for a PA module that incorporates a PA die and integrates RF passive elements including an RF combiner and transmission line inductors in the QFN leadframe for RF power combining, DC bias, and RF power matching of the PA die according to one or more embodiments of the present disclosure.

FIG. 2 shows a QFN leadframe design for a PA module that incorporates a PA die and integrates RF passive elements including an RF combiner and transmission line inductors in the QFN leadframe for RF power combining, DC bias, and RF power matching of the PA die according to one or more embodiments of the present disclosure. A QFN leadframe package 202 contains a PA module and encapsulates a PA die 204. PA die 204 may be a standalone PA die or a MMIC die that integrates the PA, regulator, and logic circuits (similar to PA die 104 of FIG. 1). PA 204 may also integrate shunt capacitors for PA output matching, and DC blocking capacitors and inductors for bias and matching if needed. Pads on the left side of QFN leadframe package 202 provide a jumper pad 206, an RF input 208 for PA die 204, ground pad 209, among others inputs. Pads on the top side of QFN leadframe package 202 provide DC voltage VCC1 210, VCC2 211, and VCC3 212 to PA die 204, and a pad 213 used for anchoring integrated passive elements. Pads on the right side of QFN leadframe package 202 provide pads 214 for anchoring other integrated passive elements, additional ground pads, and an RF output 216 from PA die 204. Pads on the bottom side of QFN leadframe package 202 provide a pad 213 for anchoring integrated passive elements, additional pads for DC voltage and a detector output 218.

The passive elements integrated on QFN leadframe package 202 include two L-shaped transmission line inductors 220, one on the top and one on the bottom of QFN leadframe package 202. Transmission line inductors 220 are electrically connected to, and mechanically supported by, pads for VCC3 212 located on the same side as the transmission line inductors 220. Transmission line inductors 220 and adjustable wire bond may be used in conjunction with capacitors and/or inductors integrated on PA die 204 to provide DC biasing or RF input matching for PA die 204. For example, PA bias chokes for DC voltage VCC3 212 may be realized by connecting wire bonds 222 from two pads on PA die 204 to the top and the bottom transmission line inductors 220. Wire bonds 221 from pads on PA die 204 to pads for VCC2 211 on the top and bottom may be used for DC biasing of a second stage of PA die 204. Jumper pad 206 may also be for DC biasing or RF input matching. For example, biasing for DC voltage VCC1 210 may be realized by connecting wire bond 230 from a pad on PA die 204 to jumper pad 206, and wire bond 232 from jumper pad 206 to pad for VCC1 210. The length of wire bonds 222, 221, 230, and 232 may be adjusted and the location and/or number of jumper pad 206 may be designed to provide the flexibility to fine tune the inductance for the desired DC biasing or RF input matching.

The passive elements integrated on QFN leadframe package 202 also includes two L-shaped transmission line inductors 224, one located on the top and the bottom of QFN leadframe package 202, for PA RF output power matching. The two transmission line inductors 224 are anchored to pads 213 on their respective sides. PA RF output power matching may be realized by connecting four wire bonds 226 from four pads on the top of PA die 204 to one end of top transmission line inductor 224, and a wire bond 228 from the other end of top transmission line inductor 224 to another pad near the top right corner of PA die 204. Similarly, four wire bonds 226 from four pads on the bottom of die 204 to one end of bottom transmission line inductor 224, and a wire bond 228 from the other end of bottom transmission line inductor 224 to another pad near the bottom right corner of PA die 204 provide PA RF output power matching on the bottom. The lengths and the number of wire bonds 226, 228 may be adjusted to provide the proper inductance and/or to fine tune the length of transmission line inductor 224 for matching the PA RF output. The inductors provided by wire bonds 226, 228 and the inductance, impedance and length of transmission line inductors 224, together with the shunt capacitor and DC block capacitor integrated on PA die 204 provide the matching network for the PA RF output appearing on RF output pad 216.

The passive element integrated on QFN leadframe package 202 also includes an RF combiner 232. RF combiner 232 includes transmission lines of proper impedance (defined by its width) and length that are used to combine output power from PA 204. RF combiner 232 has an upper arm and a lower arm, each arm anchored to a respective pad 214. The upper arm and the lower arm are joined together to form a center arm that connects to RF output pad 216. The upper and lower arm may be meandering traces of the proper length and impedance such that the characteristic impedance of the transmission lines enables RF signals injected into the two arms to be constructively combined. For example, a wire bond 234 connects from a first RF output pad on PA die 204 to one end of the upper arm of RF combiner 232. Similarly, a wire bond 236 connects from a second RF output pad on PA die 204 to one end of the lower arm of RF combiner 232. The other ends of the upper arm and the lower arm are joined by the center arm. The RF power on the upper arm and the lower arm may be combined to provide the PA RF output on RF output pad 216. RF combiner 232 may work as a RF divider when the signal direction is reversed. For example, when an RF signal is injected into the center arm, the RF power received from the upper arm and the lower arm may be the divided power of the injected RF signal. Therefore, an RF divider may also be constructed from transmission lines of the proper impedance and length integrated into a QFN leadframe package such that the characteristic impedance of the transmission lines enables the power of an RF signal injected into the RF divider to be divided. In one or more embodiments, a power combiner may be integrated with PA 202.

Detector output 218 may output a DC voltage level corresponding to the PA output power. A detector circuit integrated on PA die 204 may sense the PA output power using a small capacitor coupled to an active diode circuit. The detector circuit converts the sensed PA output power to a DC voltage that is output through detector output 218. The detector circuit may replace the coupler lines and the external detector circuit used to measure the PA output power of PA die 104 FIG. 1. Therefore, an detector circuit integrated on a PA die may be a simpler, cheaper and more compact alternative to measuring PA output power using the coupling lines and the external detector circuit. However, the simple detector integrated on the PA die is more susceptible to variations in the antenna environment or output impedance than the coupling lines and the external detector circuit. As such, the PA output power measured by the integrated detector circuit may not be as accurate as that provided by the coupling lines and the external detector circuit. Therefore, a trade-off between size and performance of the PA output power detector may be performed to determine whether to use the integrated detector circuit or the coupling lines and the external detect circuit to meet the requirements of a PA module.

Figure 3:
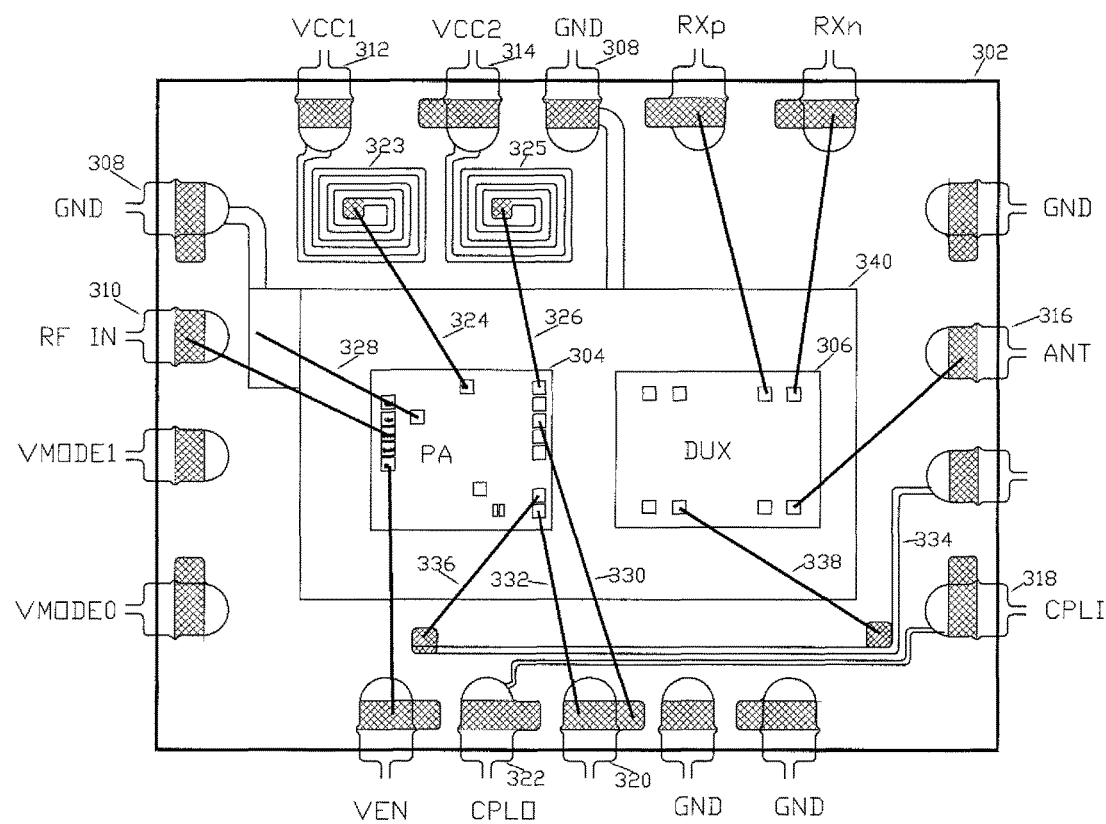
FIG. 3 shows a QFN leadframe design for a PA module that incorporates a PA die, a passive filter die, and integrated RF passive elements including RF inductors and a coupler in the QFN leadframe for DC bias, RF matching, and RF power coupling of the PA die according to one or more embodiments of the present disclosure.

FIG. 3 shows a QFN leadframe design for a PA module that incorporates a PA die, a passive filter die, and integrated RF passive elements including RF inductors and a coupler in the QFN leadframe for DC bias, RF matching, and RF power coupling of the PA die according to one or more embodiments of the present disclosure. A QFN leadframe package 302 contains a PA module and encapsulates a PA die 304 and a SAW or BAW (or other types of filter) duplexer die 306, which is a passive component used to perform filtering of the PA output and for duplexing of the antenna between transmit and receive. SAW or BAW duplexer die 306 may be a flip chip DSSP package, without solder bumps but with Au plated bond pads. SAW or BAW duplexer die 306 may be assembled like a wire bond die inside QFN leadframe package 302 using a die attach and wire bond process, similar to that used for PA die 304.

Pads on the left side of QFN leadframe package 302 provides a ground pad 308, an RF input 310 for PA die 304, and other input control signals. Pads on the top side of QFN leadframe package 302 provides DC voltage VCC1 312, VCC2 314, and inputs to SAW or BAW duplexer die 306.

Pads on the right side of QFN leadframe package 302 provide an antenna output 316 and a coupler input 318. Pads on the bottom side of QFN leadframe package 302 provides a jumper pad 320 and a coupler output 322, among others.

The passive elements integrated on QFN leadframe package 302 include spiral inductors 323, 325 that are electrically connected to, and mechanically supported by, pads for DC voltage VCC1 312 and VCC2 314, respectively. Spiral inductors 323, 325 may be used for DC biasing PA die 304 through wire bonds 324 and 326 in a DC biasing network that may also include capacitors and/or inductors integrated on PA die 304. The length of wire bonds 324 and 326 may be adjusted to provide the proper inductance for DC biasing. The passive elements integrated on QFN leadframe package 302 also include ground plane 340 for PA die 304 and SAW or BAW duplexer die 306. Ground plane 340 is anchored by one or more ground pads 308. Ground plane 340 may be used for RF inter-stage matching by connecting wire bond 328 from a pad on PA die 304 to ground plane 340 to provide the shunt inductance to ground in an inter-stage matching network that may also include capacitors and/or inductors integrated on PA die 304. The length of wire bond 328 may be adjusted to provide the proper shunt inductance for RE inter-stage matching.

The passive elements integrated on QFN leadframe package 302 also includes jumper pad 320 for output power matching. For example, PA RF output matching may be realized by connecting wire bonds 330 from a first pad on PA die 304 to jumper pad 320, and connecting wire bond 332 from jumper pad 320 to a second pad on PA die 304. The inductors provided by wire bonds 330, 332, and jumper pad 320 may be used in conjunction with the shunt capacitor and DC block capacitor integrated on PA die 304 to provide PA RF output matching. The length of wire bonds 330 and 332 may be adjusted and the location and/or the number of jumper pad 320 may be designed to provide the flexibility to fine tune the inductance for matching the PA RE output.

The passive elements integrated on QFN leadframe package 302 also include coupler lines 334 to provide RF power coupling. For example, wire bond 336 connecting from a pad of PA die 304 to a first trace of coupler lines 334 may RF-edge couple the RF output signal from PA die 304 to a second trace of coupler lines 334. The coupled RF signal may be connected through coupler output pad 322 to an external detector circuit for measurement of the PA output power. Coupler input pad 318 may be terminated for a single PAM or used to daisy chain multiple PAMs for RF power measurement with the external detector circuit. A wire bond 338 connects from the first trace of coupler lines 334 to SAW or BAW duplexer die 306 to pass PA output power from PA die 304 to SAW or BAW duplexer die 306, and then to antenna pad 316. In one or more embodiments, wire bonds may directly connect PA die 304 to SAW or BAW duplexer die 306.

Figure 4:
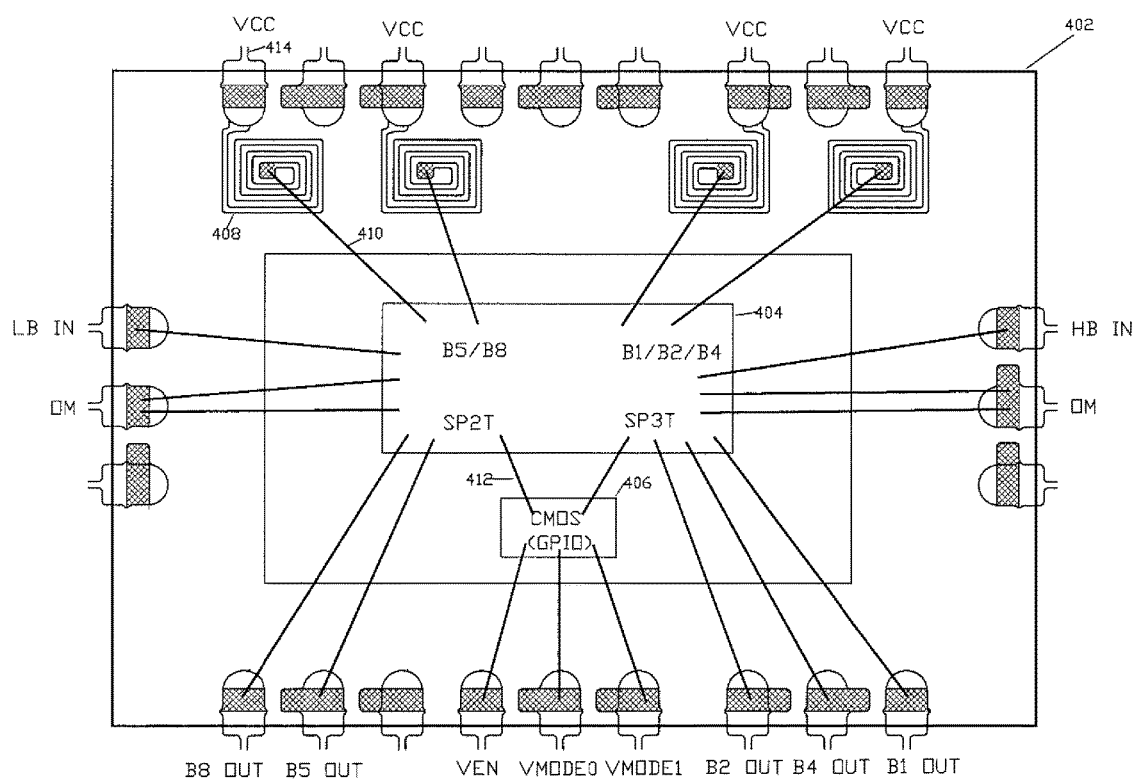
FIG. 4 shows a QFN leadframe design for a PA module that incorporates a multi-band PA and switch die, a CMOS control die, and integrated RF passive elements including RF inductors in the QFN leadframe for DC bias and RF matching of the PA die according to one or more embodiments of the present disclosure.

FIG. 4 shows a QFN leadframe design for a PA module that incorporates a multi-band PA and switch die, a CMOS control die, and integrated RF passive elements including RF inductors in the QFN leadframe for DC bias and RF matching of the PA die according to one or more embodiments of the present disclosure. A QFN leadframe package 402 contains a PA module and encapsulates a multi-band PA and switch die 404 and a CMOS control die 406. Multi-band PA and switch die 404 may be a MMIC die that integrates a multi-band PA and RF switches. The RF switches operate under the control of CMOS control die 406 to switch PA output between various output frequency bands. Pads on the left and right sides of QFN leadframe package 402 provide various inputs (low band input (LB In) and high band input (HB In)) to multi-band PA and switch die 404 and jumper pads or anchor pads (two OM pads) for PA output matching using wire bonds or transmission lines. Pads on the top side of QFN leadframe package 402 provide DC voltage VCC 414. Pads on the bottom side of QFN leadframe package 402 provide output from multi-band PA and switch die 404 and control inputs to CMOS control die 406. CMOS control die 406 may receive digital commands from baseband/MAC through various types of interface and may send commands to multi-band PA and switch die 404.

The passive elements integrated on QFN leadframe package 404 include four spiral inductors 408 that are electrically connected to, and mechanically supported by, pads for DC voltage VCC 414. Spiral inductors 408 and adjustable wire bond may be used in conjunction with capacitors and/or inductors integrated on multi-band PA and switch die 404 to provide DC biasing or RF input matching of multi-band PA and switch die 404. For example, PA bias chokes for DC voltage may be realized by connecting wire bonds 410 from pads on multi-band PA and switch die 104 to spiral inductors 408. The length of wire bond 410 may be adjusted to provide the proper inductance for DC biasing. Wire bond 412 may connect between pads on multi-band PA and switch die 404 and pads on CMOS control die 406 for CMOS control die 406 to control the switching operation of the multiple frequency bands of multi-band PA and switch die 404.

Although embodiments of the present disclosure have been described, these embodiments illustrate but do not limit the disclosure. For example, even though QFN leadframe packages are described for PA modules, the system and method may be extended to RF FEMs or other types of modules. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

We claim:

1. An apparatus comprising:
    a leadframe of a quad-flat no-lead (QFN) package for a radio frequency (RF) module;
    wherein the leadframe is patterned to integrate one or more RF passive elements;
    wherein the integrated RF passive elements are wire bonded to an active die encapsulated in the QFN package to provide adjustable RF parameters for operation of the active die;
    wherein the RF parameters include inductance, transmission line length, or RF-edge coupling;
    wherein the RF parameters are adjusted using a wire bond; and
    wherein the integrated RF passive elements include a ground bar adapted to provide an adjustment of shunt inductance for RF matching of the active die, wherein the shunt inductance is provided by the wire bond or a combination of the wire bond and an RF inductor of the integrated RF passive elements.

2. The apparatus of claim 1, wherein the integrated RF passive elements include an RF inductor adapted to provide DC bias for an amplifier, and wherein inductance of the RF inductor for the DC bias is adjusted by varying the number or the length of the wire bond.

3. The apparatus of claim 2, wherein the RF inductor is a spiral inductor or a meander line.

4. The apparatus of claim 1, wherein the integrated RF passive elements include a transmission line adapted to provide RF power matching for the active die, wherein a proper impedance of the transmission line is defined by the width of the transmission line, and wherein the length of the transmission line is adjusted by varying the number or the length of the wire bond.

5. The apparatus of claim 1, wherein the integrated RF passive elements include a pair of parallel transmission lines separated by a thin gap to provide RF-edge coupling of an output signal of the active die on a first trace of the pair of transmission lines to a second trace of the pair of the transmission lines.

6. The apparatus of claim 1, wherein the integrated RF passive elements include a jumper pad adapted to adjust the number or the length of the wire bond, wherein the jumper pad is wire bonded to the active die directly or indirectly through one of the integrated RF passive elements.

7. The apparatus of claim 1, wherein the QFN package encapsulates a passive die, an wherein the passive die is wire bonded to one or more of the integrated RF passive elements or wire bonded directly to the active die.

8. The apparatus of claim 1, wherein the RF parameters are adjusted by varying the number or the length of one or more wire bonds.

9. The apparatus of claim 1, wherein the integrated RF passive elements are anchored to the leadframe of the QFN package.

10. A method comprising:
patterning a leadframe of a quad-flat no-lead (QFN) package to integrate one or more radio frequency (RF) passive elements on the leadframe;
attaching an active die to the QFN package; and
wire bonding the active die to the integrate RF passive elements, wherein the integrated RF passive elements provide adjustable RF parameters for operation of the active die, wherein the RF parameters include inductance, transmission line length, or RF-edge coupling that are adjusted using wire bond, wherein said patterning creates a ground bar to provide an adjustment of shunt inductance for RF matching of the active die, wherein the shunt inductance is provided by the wire bond or a combination of the wire bond and an RF inductor of the integrated RF passive elements.

11. The method of claim 10, wherein said patterning creates an RF inductor to provide DC bias for an amplifier, and wherein inductance of the RF inductor for the DC bias is adjusted by varying the number or the length of the wire bond.

12. The method of claim 11, wherein the RF inductor is a spiral inductor or a meander line.

13. The method of claim 10, wherein said patterning creates a transmission line adapted to provide RF matching for the active die, wherein the proper impedance of the transmission line is defined by the width of the transmission line, and wherein the length of the transmission line is adjusted by varying the number or the length of the wire bond.

14. The method of claim 10, wherein said patterning creates a pair of parallel transmission lines separated by a thin gap to provide RF-edge coupling of an output signal of the active die on a first trace of the pair of transmission lines to a second trace of the pair of the transmission lines.

15. The method of claim 10, wherein said patterning creates a jumper pad used to adjust the number or the length of the wire bond, wherein the jumper pad is wire bonded to the active die directly or indirectly through one of the integrated RF passive elements.

16. The method of claim 10, further comprising:
attaching a passive die; and
wire bonding the passive die to one or more of the integrated RF passive elements or directly to active die.

17. The method of claim 10, further comprising varying the number or the length of one or more wire bonds to adjust the RF parameters.

18. The method of claim 10, further comprising anchoring the integrated RF passive elements to the leadframe of the QFN package.

* * * * *